US012745505B1

(12) United States Patent
Kobamoto et al.

(10) Patent No.: US 12,745,505 B1
(45) Date of Patent: Sep. 22, 2026

(54) SOLAR CELLS AND CONDUCTIVE TRANSPARENT SUBSTRATES FOR SOLAR CELLS

(71) Applicants: NIPPON SHEET GLASS COMPANY, LIMITED, Tokyo (JP); PILKINGTON GROUP LIMITED, Lancashire (GB)

(72) Inventors: Naoya Kobamoto, Tokyo (JP); Satoshi Tanaka, Tokyo (JP); Jun Ni, Maumee, OH (US); Lila Raj Dahal, Perrysburg, OH (US); Srikanth Varanasi, Ottawa Hills, OH (US); Keiko Tsuri, Tokyo (JP)

(73) Assignees: NIPPON SHEET GLASS COMPANY, LIMITED, Tokyo (JP); PILKINGTON GROUP LIMITED, Nr. Ormskirk Lancashire (GB)

( * ) Notice: Subject to any disclaimer, the term of this patent is extended or adjusted under 35 U.S.C. 154(b) by 0 days.

(21) Appl. No.: 19/194,122

(22) Filed: Apr. 30, 2025

(51) Int. Cl.
*H10K 30/40* (2023.01)
*H10K 30/50* (2023.01)

(52) U.S. Cl.
CPC ............. *H10K 30/40* (2023.02); *H10K 30/50* (2023.02)

(58) Field of Classification Search
CPC ............................... H10K 30/40; H10K 30/50
See application file for complete search history.

(56) References Cited

U.S. PATENT DOCUMENTS

2012/0067392 A1* 3/2012 Gloeckler ............. H10F 71/125 438/57
2012/0118362 A1* 5/2012 Matsui ................ H10F 77/1692 428/161
2012/0125432 A1* 5/2012 Matsui .................. C23C 16/407 438/85

FOREIGN PATENT DOCUMENTS

JP S6193672 * 5/1986
JP 2022191380 A 12/2022

OTHER PUBLICATIONS

Grace Dansoa Tabi et al., "Performance Potential for Locally Contacted Perovskite Solar Cells" Sol. RRL 2024, 8, 2301078 (May 2, 2024).

* cited by examiner

*Primary Examiner* — Jayne L Mershon
(74) *Attorney, Agent, or Firm* — SZDC Law PC

(57) ABSTRACT

An electrically conductive transparent substrate for a solar cell includes: a light-transmitting substrate; an electrically conductive layer facing a face of the substrate and having irregularities at a face opposite to the substrate; and a buffer layer made of a material with a resistance higher than a resistance of a material of the electrically conductive layer and disposed on the irregularities, the electrically conductive transparent substrate satisfying the following expression: $0.02 \leq d/R \leq 0.06$ at any planar position, where d denotes a thickness of the buffer layer, and R denotes a height of the irregularities.

8 Claims, 3 Drawing Sheets

SOLAR CELLS AND CONDUCTIVE TRANSPARENT SUBSTRATES FOR SOLAR CELLS

TECHNICAL FIELD

The present invention relates to an electrically conductive transparent substrate for use in a solar cell and including a light-transmitting element and to a solar cell.

BACKGROUND ART

A solar cell includes a sequential stack of, for example, a light-transmitting substrate such as a glass substrate, a light-transmitting electrically conductive layer, an electron transport layer, a light absorption layer, a hole transport layer, and an electrode. The light absorption layer receives light and generates pairs of electrons and positive hole serving as carriers, the movement of which allows the solar cell to generate electricity as a result of optical energy being converted into electric energy.

The solar cell may let electrons and positive hole be dispersed in layers such as the light absorption layer and the electrode to recombine with one another, reducing carriers. Specifically, the recombination coverts electric energy into thermal energy and decreases the electric energy, and also reduces carriers and decreases the efficiency of electricity generation by the solar cell.

The electrically conductive layer is often formed by chemical vapor deposition (CVD) and have irregularities at a face. The electron transport layer, which is disposed on the electrically conductive layer, may have an unevenness thickness due to the irregularities, specifically, a large thickness at a raised portion of the electrically conductive layer and a small thickness at a lower portion of the electrically conductive layer.

The electron transport layer restricts the movement of positive holes in an area with a sufficient thickness to sufficiently prevent recombination of positive holes (that is, carriers) generated in the light absorption layer. The electron transport layer, on the other hand, lets carriers (that is, positive holes) move easily in an area with an insufficient thickness, thereby failing to sufficiently prevent recombination of positive holes.

A solar cell may include a buffer layer between the light absorption layer and the electrically conductive layer to restrict the movement of positive holes and prevent recombination thereof, reducing conversion of electric energy into thermal energy. The buffer layer, however, causes resistance heat due to its resistance when electrons move from the light absorption layer to the electrically conductive layer, losing thermal energy and reducing electric energy. A large energy loss due to the movement of electrons results in a decrease in the efficiency of electricity generation.

Non-patent Literature 1 discloses a buffer layer with partial openings (that is, a contact area) for a light absorption layer and an electrically conductive layer (that is, an electron transport layer) to be in direct contact with each other to control, in a balanced manner, energy loss due to the recombination and energy loss due to the resistance to the movement of electrons.

Controlling energy loss in a balanced manner, however, requires controlling, for example, the area of the openings and the area ratio between the openings and the other portion, making it difficult to produce an appropriate buffer layer.

CITATION LIST

Patent Literature

Patent Literature 1
JP 2022-191380 A
Non-Patent Literature 1
Sol. RRL 2024 8, 2301078

SUMMARY OF INVENTION

Technical Problem

The present invention has an object of providing an electrically conductive transparent substrate and a solar cell each of which prevents recombination of carriers and ensures high efficiency of electricity generation.

Solution to Problem

In order to attain the above object, an electrically conductive transparent substrate as an embodiment of the present invention includes: a light-transmitting substrate; an electrically conductive layer facing a face of the substrate and having irregularities at a face opposite to the substrate; and a buffer layer made of a material with a resistance higher than a resistance of a material of the electrically conductive layer and disposed on the irregularities, the electrically conductive transparent substrate satisfying the following expression: $0.02 \leq d/R \leq 0.06$ at any planar position, where d denotes a thickness of the buffer layer, and R denotes a height of the irregularities.

Irregularities on an electric conductor cause electric charge to concentrate at raised (or pointed) portions. A buffer layer with irregularities causes electric charge to concentrate more at some portions and less at other portions. Concentration of electric charge increases the voltage of electric current, but causes more carriers to recombine.

The irregularities of the buffer layer deconcentrate electric charge, thereby appropriately balancing prevention of the recombination with the efficiency of electricity generation (that is, the voltage of electric current). This controls energy loss in a balanced manner and prevents a decrease in the efficiency of electricity generation.

The electrically conductive transparent substrate may be further configured such that the material of the buffer layer has a band gap of not less than 3.4 eV and not more than 12 eV.

With the above configuration, adjusting the thickness of the buffer layer allows the solar cell to easily prevent recombination of carriers and ensure high efficiency in electricity generation in a balanced manner. The material has a band gap of not less than 3.4 eV, and should preferably have a band gap of not less than 6.0 eV, more preferably not less than 8.0 eV.

The electrically conductive transparent substrate may be further configured such that the material of the buffer layer is silica.

With the above configuration, adjusting the thickness of the buffer layer allows the solar cell to easily prevent recombination of carriers and ensure high efficiency in electricity generation in a balanced manner.

The electrically conductive transparent substrate may be further configured such that the thickness d is not less than 0.5 nm and not more than 1.5 nm, and the material of the buffer layer has a band gap of not less than 8.0 eV and not more than 12 eV.

With the above configuration, adjusting the thickness and band gap (that is, resistance) of the buffer layer allows the solar cell to easily prevent recombination of carriers and ensure high efficiency in electricity generation in a balanced manner.

The electrically conductive transparent substrate may be further configured such that the material of the buffer layer includes at least one of inorganic perovskite, aluminum oxide, hafnium oxide, zirconium oxide, gallium oxide, gallium nitride, or silica.

With the above configuration, adjusting the thickness and resistance (that is, band gap) of the buffer layer allows the solar cell to easily prevent recombination of carriers and ensure high efficiency in electricity generation in a balanced manner.

The electrically conductive transparent substrate may further include: an electron transport layer or hole transport layer for the solar cell, the electron transport layer or hole transport layer being disposed on a face of the buffer layer which face is opposite to the electrically conductive layer and entirely or partially covering the buffer layer.

With the above configuration, adjusting the thickness and resistance (that is, band gap) of each of the buffer layer and the electron transport layer (or hole transport layer) adjusts the ease of the movement of carriers. This easily allows the solar cell to prevent recombination of carriers and ensure high efficiency in electricity generation in a balanced manner.

A solar cell as an embodiment of the present invention includes: the electrically conductive transparent substrate; and a light absorption layer configured to generate a carrier in response to receiving light, the light absorption layer including organic perovskite.

The above configuration provides a perovskite solar cell that prevents recombination of carriers and ensures high efficiency in electricity generation in a balanced manner.

A solar cell as an embodiment of the present invention includes: the electrically conductive transparent substrate; and a light absorption layer configured to generate a carrier in response to receiving light, the light absorption layer including crystal silicon.

The above configuration provides a silicon solar cell that prevents recombination of carriers and ensures high efficiency in electricity generation in a balanced manner.

DESCRIPTION OF EMBODIMENTS

Solar Cell

Figure 1:
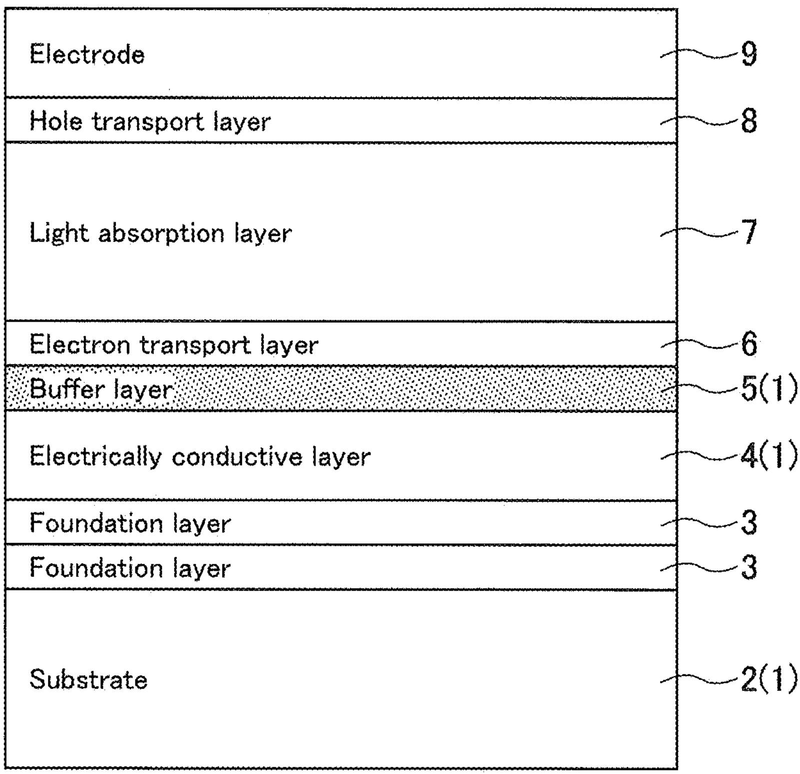
FIG. 1 is a diagram schematically illustrating an example configuration of a solar cell.

The description below first deals with the configuration of a solar cell for the present embodiment and that of an electrically conductive transparent substrate 1 for use in a solar cell, with reference to FIG. 1. The electrically conductive transparent substrate 1 transmits light, as it is positioned to receive light in a solar cell. The description below assumes the solar cell to be a perovskite solar cell as an example. FIGS. 1 to 9 referred to below each conceptually illustrate a solar cell (or an electrically conductive transparent substrate 1 therein) as seen laterally.

A solar cell generates electricity due to its photovoltaic effect (or photoelectric effect), that is, in response to receiving light to generate carriers c (see FIG. 2) and the carriers c moving. The carriers c include pairs of electrons e and positive holes h (see FIG. 2).

The solar cell for the present embodiment includes a sequential stack of a substrate 2, foundation layers 3, an electrically conductive layer 4, a buffer layer 5, an electron transport layer 6, a light absorption layer 7, a hole transport layer 8, and an electrode 9.

The substrate 2 is made of glass or the like and transmits light. The foundation layers 3 are on a face of the substrate 2 which face is opposite to its light-receiving face, and allow the electrically conductive layer 4 to be joined closely to the substrate 2. The solar cell may include a single foundation layer 3 or two or more foundation layers 3. The drawings each illustrate a solar cell including two foundation layers 3 as an example.

The light absorption layer 7 receives light incident on the substrate 2 and generates pairs of electrons e and positive holes h as carriers c. If the solar cell is a perovskite solar cell, the light absorption layer 7 is made of perovskite.

The electron transport layer 6 efficiently collects electrons e generated in the light absorption layer 7 and transports the electrons e to the electrically conductive layer 4. The electron transport layer 6 includes tin oxide ($SnO_2$), for example.

The electrically conductive layer 4 faces a face of the substrate 2, and transmits light to let the light reach the light absorption layer 7. The electrically conductive layer 4 collects electrons e from the electron transport layer 6 and supplies electric current to an external circuit, meaning that the electrically conductive layer 4 functions as an electrode (specifically, a positive electrode). The electrically conductive layer 4 includes tin oxide ($SnO_2$), for example, and has a thickness of 200 nm.

The buffer layer 5 is on a face of the electrically conductive layer 4 which face is opposite to the substrate 2. The buffer layer 5 adjusts movement of the carriers c as described later. The buffer layer 5 is made of an insulator such as silicon oxide ($SiO_2$) with a resistance higher than that of the electrically conductive layer 4.

The hole transport layer 8 efficiently collects positive holes h generated in the light absorption layer 7 and transports the positive holes h to the electrode 9. The hole transport layer 8 includes nickel oxide ($NiO_X$), for example.

The electrode 9 collects positive holes h from the hole transport layer 8 and supplies electric current to an external circuit, meaning that the electrode 9 functions as a positive electrode.

The electrically conductive transparent substrate 1 includes at least a substrate 2, an electrically conductive layer 4, and a buffer layer 5, and may optionally further include layers such as a foundation layer 3 and an electron transport layer 6.

Recombination

Figure 2:
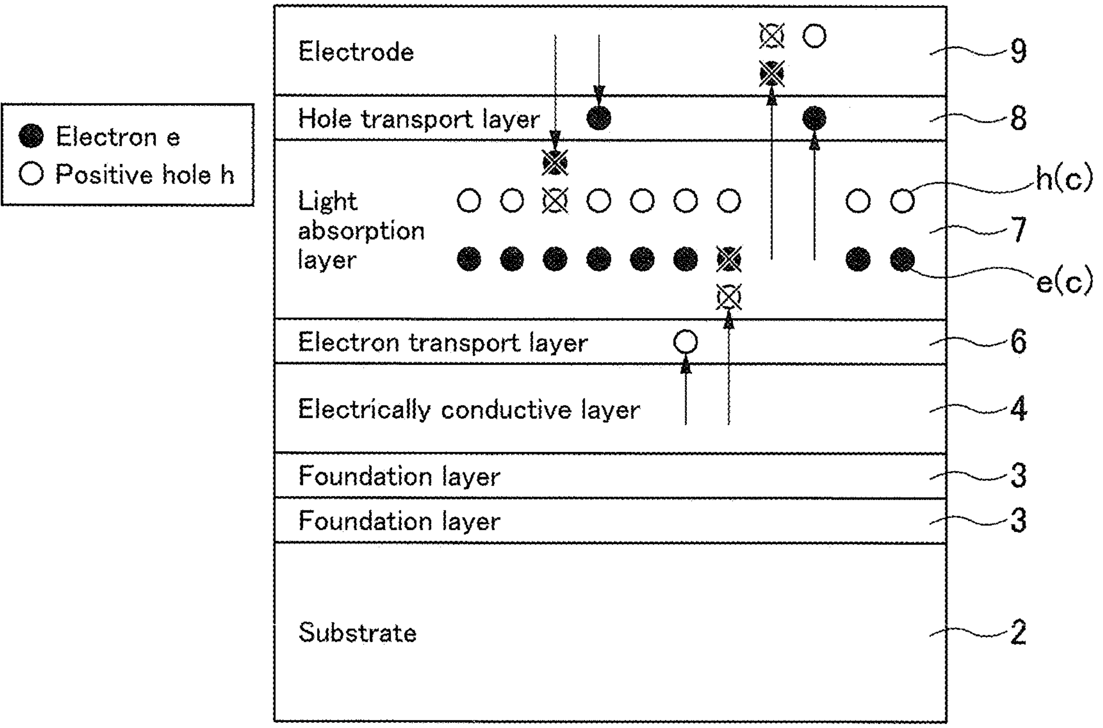
FIG. 2 is a diagram illustrating how carriers recombine.
Figure 3:
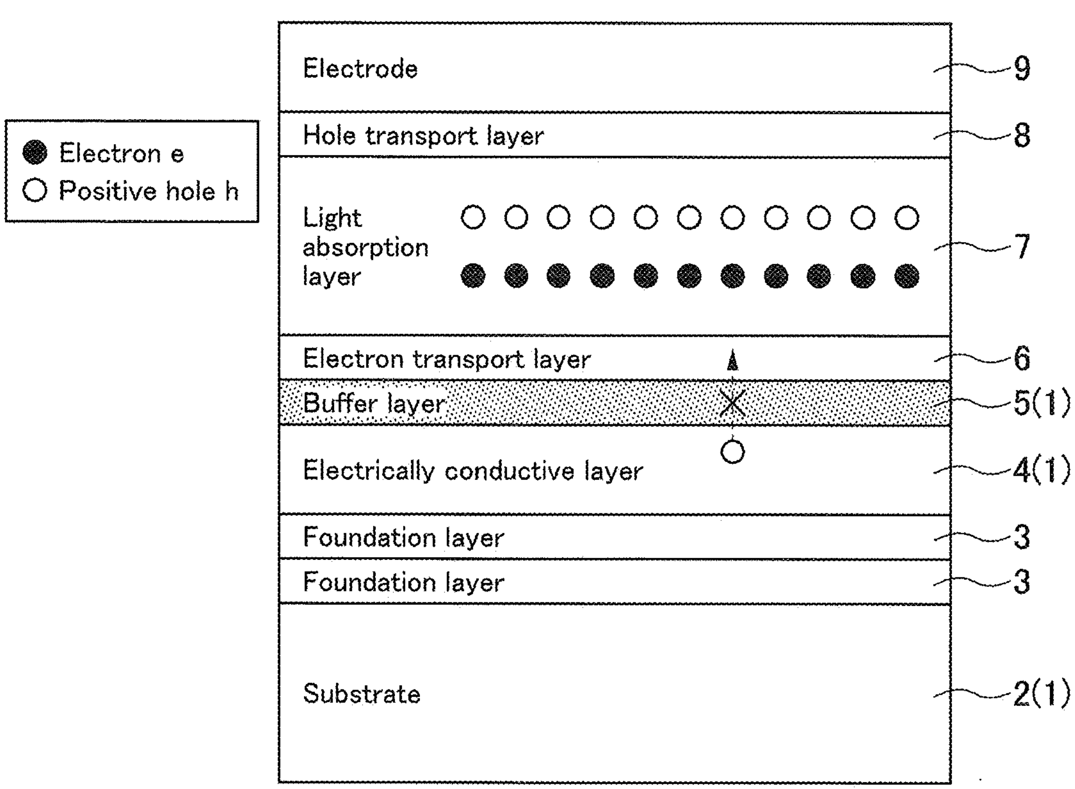
FIG. 3 is a diagram illustrating how to prevent recombination of carriers.
Figure 4:
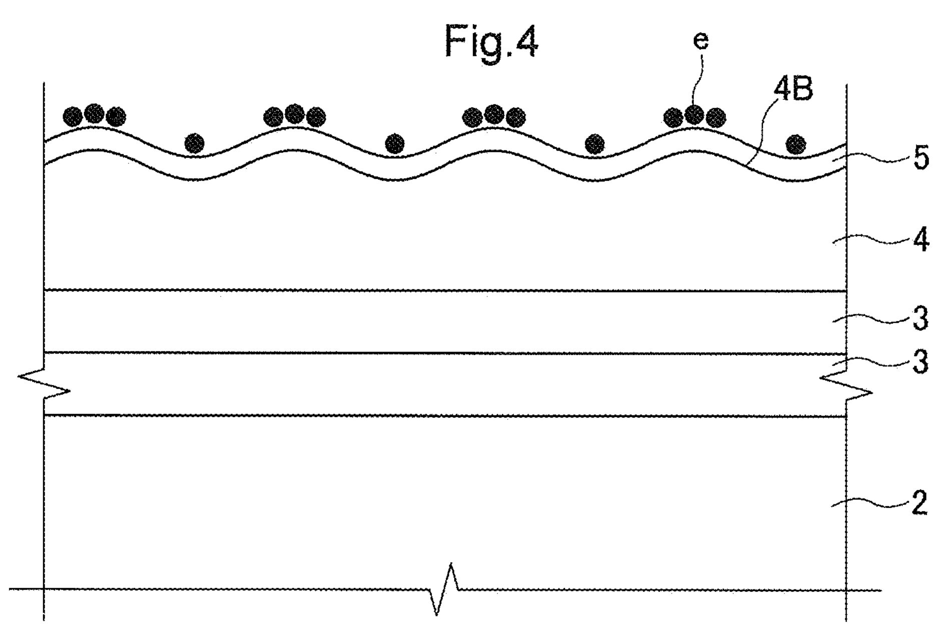
FIG. 4 is a diagram schematically illustrating a main portion of a solar cell with irregularities of an electrically conductive layer.
Figure 5:
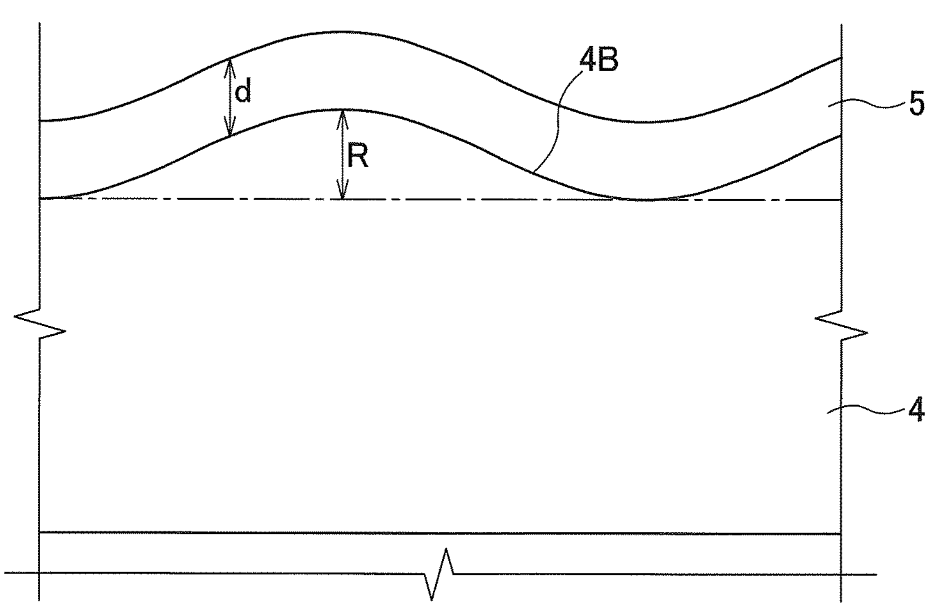
FIG. 5 is a diagram illustrating the height of irregularities of an electrically conductive layer and the thickness of a buffer layer.

The description below deals with how carriers c recombine in a conventional solar cell, with reference to FIGS. 1 and 2.

As described above, the light absorption layer 7 receives light and generates pairs of electrons e and positive holes h. The positive holes h move to the electrode 9, whereas the electrons e move to the electrically conductive layer 4. These movements allow the solar cell to generate electricity.

The carriers c may be dispersed such that electrons e move from the electrode 9 to the light absorption layer 7 to recombine with positive holes h generated in the light absorption layer 7 or that positive holes h move from the electrically conductive layer 4 to the light absorption layer 7 to recombine with electrons e generated in the light absorption layer 7. Further, electrons e may move to the electrode 9 to recombine with positive holes h from the light absorption layer 7, whereas positive holes h may move to the electrically conductive layer 4 to recombine with electrons e from the light absorption layer 7. Such recombination results in a decrease in the efficiency of electricity generation by the solar cell.

While the electron transport layer 6 and the hole transport layer 8 restrict the movement of carriers c to reduce recombination thereof, restricting the movement more than necessity will prevent positive holes h from moving from the light absorption layer 7 to the electrode 9 or electrons e from moving from the light absorption layer 7 to the electrically conductive layer 4, with the result of a decrease in the efficiency of electricity generation. The electron transport layer 6 and the hole transport layer 8 are not necessarily capable of easily keeping the efficiency of electricity generation while sufficiently restricting those movements of carriers c which can cause recombination thereof, namely, the movement of electrons e from the electrode 9 to the light absorption layer 7, that of positive holes h from the electrically conductive layer 4 to the light absorption layer 7, that of electrons e to the electrode 9, and that of positive holes h to the electrically conductive layer 4. In other words, the solar cell needs to restrict the movement of carriers c in a balanced manner to keep the efficiency of electricity generation while preventing the recombination.

Buffer Layer

The buffer layer 5 allows the solar cell to easily restrict the movement of carriers c, which can cause recombination thereof, in a balanced manner as mentioned above. The buffer layer 5 is made of an insulator, that is, a material with a resistance higher than the material of the electrically conductive layer 4. The description below deals with how the buffer layer 5 prevents recombination of carriers c, with reference to FIGS. 1 and 3.

The buffer layer 5, which is between the electrically conductive layer 4 and the electron transport layer 6, has a resistance (that is, band gap) larger than that of the electron transport layer 6 and a thickness smaller than that of the electron transport layer 6. In other words, the soler cell includes a buffer layer 5 disposed between the electrically conductive layer 4 and the electron transport layer 6 and having a large resistance and a small thickness.

As described above, positive holes h moving from the electrically conductive layer 4 to the light absorption layer 7 recombine with electrons e generated in the light absorption layer 7. Positive holes h moving from the light absorption layer 7 to the electrically conductive layer 4 recombine in the electrically conductive layer 4 with electrons e generated in the light absorption layer 7 and flowing to the electrically conductive layer 4.

An electron transport layer 6 with a sufficiently large resistance (that is, band gap) restricts the movement of positive holes h from the electrically conductive layer 4 to the light absorption layer 7 and that of positive holes h from the light absorption layer 7 to the electrically conductive layer 4 to prevent the recombination. An electron transport layer 6 with an insufficient resistance does not prevent the recombination.

The present embodiment is configured such that even if the electron transport layer 6 has an insufficient resistance, the buffer layer 5 restricts the movement of positive holes h from the electrically conductive layer 4 to the light absorption layer 7 and that of positive holes h from the light absorption layer 7 to the electrically conductive layer 4. This prevents recombination of electrons e and positive holes h in layers such as the light absorption layer 7 and the electrically conductive layer 4, and allows the solar cell to keep its efficiency of electricity generation.

A buffer layer 5 with an excessively large resistance (that is, band gap) or an excessively small thickness will restrict the movement of electrons e from the light absorption layer 7 to the electrically conductive layer 4, which movement is necessary for the solar cell to generate electricity. The buffer layer 5 has a resistance and a thickness that are adjusted within a range of an appropriate balance by, for instance, increasing the resistance and decreasing the thickness. This allows the buffer layer 5 to restrict that movement of positive holes h which can cause recombination and keep sufficient the movement of electrons e from the light absorption layer 7 to the electrically conductive layer 4, which movement is necessary to generate electricity. This in turn allows the solar cell to prevent recombination of carriers c and ensure high efficiency in electricity generation in a balanced manner.

Thickness of Buffer Layer

The description below deals with irregularities 4B at a face of the electrically conductive layer 4 and the thickness d of the buffer layer 5 with reference to FIGS. 1, 2, 4, and 5.

The electrically conductive layer 4, which is formed by chemical vapor deposition (CVD), has irregularities 4B at a face opposite to the substrate 2. The buffer layer 5 is formed on the irregularities 4B and may tend to have an uneven thickness, but is formed to have an even thickness.

Specifically, the buffer layer 5 is designed such that $$0.02 \leq d/R \leq 0.06$$

at any planar position, where d denotes the thickness of the buffer layer 5 on irregularities 4B at a face of the electrically conductive layer 4 which face is opposite to the substrate 2, and R denotes the height of the irregularities 4B. The buffer layer 5 has an even thickness d in a range that satisfies the above expression.

Irregularities on the electric conductor (including layers such as the electrically conductive layer 4 and the buffer layer 5) cause electric charge to concentrate at raised (or pointed) portions, in other words, electrons e (or positive holes h) to collect at the raised portions. This increases the voltage of electric current flowing through the raised portions.

The buffer layer 5 has an even thickness d along the irregularities 4B and has raised portions as a result. The raised portions attract positive holes h and let the positive holes h recombine with electrons e, with the result of thermal energy being generated. On the other hand, the high voltage facilitates movement of electrons e to reduce the resistance heat. In other words, the buffer layer 5, which has an even thickness d along the irregularities 4B, is similar to a buffer layer with an appropriate contact area in that the buffer layer 5 reduces energy loss in a balanced manner and prevents a decrease in the efficiency of electricity generation.

The depressed portions of the buffer layer 5 collect fewer electrons e and similarly fewer positive holes h. The depressed portions resist electric current more strongly and let greater resistance heat be generated, but reduce recombination of carriers c to reduce generation of thermal energy. The buffer layer 5 is similar to a buffer layer with an appropriate contact area in that the buffer layer 5 reduces energy loss in a balanced manner and prevents a decrease in the efficiency of electricity generation.

As described above, the buffer layer 5 has an even thickness d along the irregularities 4B of the electrically conductive layer 4 to control the movement of carriers c in a balanced manner in accordance with the irregularities of the buffer layer 5. The buffer layer 5, which does not need a balanced contact area and only needs an even thickness d, is similar to a buffer layer with an appropriate contact area in that the buffer layer 5 controls energy loss in a balanced manner and prevents a decrease in the efficiency of electricity generation.

Insulator

The description below deals in detail with the configuration of an insulator included in the buffer layer 5, with reference to FIGS. 1 to 5. The insulator is a material with a resistance higher than that of the material of the electrically conductive layer 4.

A buffer layer 5 (which includes an insulator) with a large band gap (that is, a high resistance) typically restricts the movement of carriers c greatly. Such a buffer layer 5 prevents recombination of carriers c but has poor efficiency in electricity generation due to the high resistance. A buffer layer 5 with a small band gap (that is, a low resistance) ensures high efficiency in electricity generation thanks to the low resistance. Such a buffer layer 5 is, however, incapable of easily restricting the movement of carriers c and preventing recombination of carriers c. A buffer layer 5 with a large thickness d restricts the movement of carriers c greatly. Such a buffer layer 5 prevents recombination of carriers c but has poor efficiency in electricity generation due to the high resistance. A buffer layer 5 with a small thickness d ensures high efficiency in electricity generation thanks to the low resistance. Such a buffer layer 5 is, however, incapable of easily restricting the movement of carriers c and preventing recombination of carriers c.

In view of the above, the insulator should preferably have a band gap of not less than 3.4 eV and not more than 12 eV. This allows the thickness d to be adjusted within an easily adjustable range for adjustment of the movement of carriers c. This in turn allows the solar cell to prevent recombination of carriers c and ensure high efficiency in electricity generation in a balanced manner. In other words, using an insulator with a band gap of not less than 3.4 eV and not more than 12 eV allows the thickness d of the buffer layer 5 to be adjusted easily for carriers c to be so mobile as to prevent recombination of carriers c and ensure high efficiency in electricity generation in a balanced manner. The insulator has a band gap of not less than 3.4 eV, which is similar to that of gallium nitride. The insulator should preferably have a band gap of not less than 6.0 eV, more preferably not less than 8.0 eV.

More specifically, if the insulator has a band gap of not less than 8.0 eV and not more than 12 eV, the buffer layer 5 should preferably have a thickness d of not less than 0.5 nm and not more than 1.5 nm. This in turn allows the solar cell to prevent recombination of carriers c and ensure high efficiency in electricity generation in a balanced manner.

The buffer layer 5 may include any insulator, which may include at least one of inorganic perovskite, aluminum oxide (that is, alumina [$Al_2O_3$]), hafnium oxide ($HfO_2$), zirconium oxide ($ZrO_2$), gallium oxide ($Ga_2O_3$), gallium nitride (GaN), or silica ($SiO_2$, which may be doped with fluorine). The insulator may be silica ($SiO_2$), for example. This facilitates adjusting the band gap and thickness d of the buffer layer 5, and allows the solar cell to prevent recombination of carriers c and ensure high efficiency in electricity generation in a balanced manner.

Specifically, if the electrically conductive layer 4 has been formed of tin oxide ($SnO_2$) by CVD and has a thickness of 20 nm and a surface roughness of 10 nm to 50 nm, the buffer layer 5 may be made of silica ($SiO_2$) with a thickness d of 0.8 nm.

ALTERNATIVE EMBODIMENTS (1) The buffer layer 5 for the embodiment described above may include two or more sublayers with respective resistances (that is, band gaps) different from each other. The thickness d may, in that case, refer to the combined thickness of the buffer layer 5 or to the thickness of the sublayer adjacent to the electrically conductive layer 4.

The sublayers should preferably have respective resistances that are larger toward the electrically conductive layer 4. This allows the buffer layer 5 to restrict the movement of positive holes h further in an area closer to the electrically conductive layer 4, thereby efficiently preventing positive holes h from moving from the electrically conductive layer 4 to the light absorption layer 7.

(2) The electrically conductive transparent substrate 1 for any of the embodiments described above may include an electrically conductive layer 4 and a buffer layer 5 over the substrate 2 and optionally an electron transport layer 6 on the buffer layer 5. The electrically conductive transparent substrate 1 for a solar cell may, in other words, include an electron transport layer 6 for the solar cell, the electron transport layer 6 being disposed on a face of the buffer layer 5 which face is opposite to the electrically conductive layer 4 and entirely or partially covering the buffer layer 5. This facilitates producing a solar cell with the electrically conductive transparent substrate 1. The electrically conductive transparent substrate 1 may include a hole transport layer 8 instead of the electron transport layer 6.

(3) The solar cell for any of the embodiments described above may be a perovskite solar cell. The solar cell may, in that case, include an electrically conductive transparent substrate 1 and a light absorption layer 7, the electrically conductive transparent substrate 1 including an electrically conductive layer 4 and a buffer layer 5 on the electrically conductive layer 4, the light absorption layer 7 including organic perovskite for generating carriers c in response to receiving light. This in turn allows the solar cell to prevent recombination of carriers c and ensure high efficiency in electricity generation in a balanced manner.

Similarly, the solar cell may be a silicon-based solar cell. The solar cell may, in that case, include an electrically conductive transparent substrate 1 and a light absorption layer 7, the electrically conductive transparent substrate 1 including an electrically conductive layer 4 and a buffer layer 5 on the electrically conductive layer 4, the light absorption layer 7 including crystal silicon for generating carriers c in response to receiving light. This in turn allows the solar cell to prevent recombination of carriers c and ensure high efficiency in electricity generation in a balanced manner.

(4) The buffer layer 5 for any of the embodiments described above may be between the hole transport layer 8 and the electrode 9. This prevents recombination of carriers c and simultaneously keeps the movement of positive holes h to the electrode 9 to keep the efficiency of electricity generation.

INDUSTRIAL APPLICABILITY

The present invention is applicable to a solar cell and an electrically conductive transparent substrate for use in a solar cell.

REFERENCE SIGNS LIST

1 Electrically conductive transparent substrate
4 Electrically conductive layer
4B Irregularities
5 Buffer layer
6 Electron transport layer
7 Light absorption layer
8 Hole transport layer
c Carrier
d Thickness
e Electron
h Positive hole
R Height

The invention claimed is:

1. An electrically conductive transparent substrate for a solar cell, the electrically conductive transparent substrate comprising:

a light-transmitting substrate;

an electrically conductive layer facing a face of the substrate and having irregularities at a face opposite to the substrate; and a buffer layer made of a material with a resistance higher than a resistance of a material of the electrically conductive layer and disposed on the electrically conductive layer, on the face opposite to the substrate that has the irregularities, the electrically conductive transparent substrate satisfying the following expression:

$$0.03 \leq d/R \leq 0.06$$

at any planar position, where d denotes a thickness of the buffer layer, and R denotes a height of the irregularities.

2. The electrically conductive transparent substrate according to claim 1, wherein the material of the buffer layer has a band gap of not less than 3.4 eV and not more than 12 eV.

3. The electrically conductive transparent substrate according to claim 1, further comprising:

an electron transport layer or hole transport layer for the solar cell, the electron transport layer or hole transport layer being disposed on a face of the buffer layer which face is opposite to the electrically conductive layer and entirely or partially covering the buffer layer.

4. An electrically conductive transparent substrate for a solar cell, the electrically conductive transparent substrate comprising:

a light-transmitting substrate;

an electrically conductive layer facing a face of the substrate and having irregularities at a face opposite to the substrate; and a buffer layer made of a material with a resistance higher than a resistance of a material of the electrically conductive layer and disposed on the electrically conductive layer, on the face opposite to the substrate that has the irregularities, the electrically conductive transparent substrate satisfying the following expression:

$$0.02 \leq d/R \leq 0.06$$

at any planar position, where d denotes a thickness of the buffer layer, and R denotes a height of the irregularities, wherein the material of the buffer layer is silica.

5. An electrically conductive transparent substrate for a solar cell, the electrically conductive transparent substrate comprising:

a light-transmitting substrate;

an electrically conductive layer facing a face of the substrate and having irregularities at a face opposite to the substrate; and a buffer layer made of a material with a resistance higher than a resistance of a material of the electrically conductive layer and disposed on the electrically conductive layer, on the face opposite to the substrate that has the irregularities, the electrically conductive transparent substrate satisfying the following expression:

$$0.02 \leq d/R \leq 0.06$$

at any planar position, where d denotes a thickness of the buffer layer, and R denotes a height of the irregularities, wherein the thickness d is not less than 0.5 nm and not more than 1.5 nm, and the material of the buffer layer has a band gap of not less than 8.0 eV and not more than 12 eV.

6. The electrically conductive transparent substrate according to claim 5, wherein the material of the buffer layer includes at least one of inorganic perovskite, aluminum oxide, hafnium oxide, zirconium oxide, gallium oxide, gallium nitride, or silica.

7. A solar cell, comprising:

an electrically conductive transparent substrate according to claim 1; and a light absorption layer configured to generate a carrier in response to receiving light, the light absorption layer including organic perovskite.

8. A solar cell, comprising:

an electrically conductive transparent substrate according to claim 1; and a light absorption layer configured to generate a carrier in response to receiving light, the light absorption layer including crystal silicon.

* * * * *